United States Patent [19]

Peelman

[11] Patent Number: 4,657,724
[45] Date of Patent: Apr. 14, 1987

[54] NEUTRON GENERATOR ION SOURCE PULSER

[75] Inventor: Harold E. Peelman, Houston, Tex.

[73] Assignee: Halliburton Company, Duncan, Okla.

[21] Appl. No.: 597,296

[22] Filed: Apr. 6, 1984

[51] Int. Cl.$^4$ .............................................. G21B 1/00
[52] U.S. Cl. .................................. 376/119; 250/260; 250/270
[58] Field of Search ................ 376/111, 119; 250/260, 250/264, 270

[56] References Cited

U.S. PATENT DOCUMENTS

| | | | |
|---|---|---|---|
| 4,280,048 | 7/1981 | Smith | 376/111 |
| 4,288,696 | 9/1981 | Peelman et al. | 376/119 X |
| 4,298,805 | 11/1981 | Dennis | 376/111 |
| 4,388,529 | 6/1983 | Peelman | 250/270 |
| 4,424,444 | 1/1984 | Smith, Jr. et al. | 250/270 |
| 4,432,929 | 2/1984 | Bridges | 250/261 X |
| 4,487,737 | 12/1984 | Bridges | 376/119 |
| 4,540,883 | 9/1985 | Randall | 250/270 X |

FOREIGN PATENT DOCUMENTS 2092841  8/1982  United Kingdom ................ 376/119

Primary Examiner—Peter A. Nelson
Attorney, Agent, or Firm—William J. Beard

[57] ABSTRACT

For use in a pulsed control system in a logging tool cooperative with a neutron generator, a pulsed ion source power supply is set forth in the preferred and illustrated embodiment. A string of field effect transistors (FET) connected between high voltage supply and ground is connected for switching the output voltage to form pulses of a desired amplitude and frequency. A timing circuit forms off and on control signals applied to pulse forming circuits. Pulse forming circuits form signals applied to gates of the FETs for timed control thereof, controlling the formation of a high voltage pulsed output signal applied to the neutron generator.

13 Claims, 3 Drawing Figures

NEUTRON GENERATOR ION SOURCE PULSER

BACKGROUND OF THE DISCLOSURE

In logging procedures, a common mode of irradiation is bombardment of the formations adjacent to the borehole with neutrons generated by a pulsed neutron tube. A pulsed neutron tube is operated periodically to form the neutron flux for obtaining an output signal at a radiation detector located in the logging tool. The neutron generator and the circuitry associated with it must be operated at relatively high temperatures typically encountered in downhole conditions. These high temperatures cause thermal drift for transistorized circuitry. Accordingly, it is difficult to obtain a stable pulsed ion source high voltage supply for operation of the neutron generator which is capable of adjustment to form pulses at varying lengths and at different frequencies. It is desirable to operate the neutron generator at different times with different pulse rates and different pulse widths. Thus, the width of the pulses may vary by perhaps ten fold, and the pulse repetition rate of frequency may vary also by ten fold.

The apparatus of this circuit is an ion source high voltage power supply capable of being pulsed at different pulse widths and different frequencies. The circuit disclosed herein is particularly deirable because it is temperature stable (transistor impedance increase with temperature constrains thermal runaway), an advantage over circuits utilizing bipolar output transistors. The change in temperature from ambient temperatures at the surface to temperatures encountered in deep wells initiates drift or even thermal runaway in bipolar transistors and hence renders such high voltage power supplies inoperative. Accordingly, this circuit is able to adjust over a range to provide wideband tuning of pulse width and frequency. Moreover, the circuit will operate at ambient temperatures and the high temperatures normally encountered in downhole conditions. For this reason, the pulsed neutron generator can then be operated at any desirable pattern for the neutron flux formed by the generator.

One advantage of this apparatus is a wide range of tuning. That is, the device is able to form pulses of different widths. The width adjustment accommodates a large range of pulse widths; in fact, there is a wide range of pulse widths permitted in the circuit itself, and practicalities limit pulse width. Likewise, pulse frequency can be varied widely and is limited only by the practicalities of application.

Another advantage of this device is the utilization of an interlocking system whereby a string of FETs connected between the high voltage output terminal and ground has FETs grouped into two groups. The two groups are switched with a timing sequence between the groups to thereby assure proper overlap. The overlap in timing protects the FET string against the unwanted circumstance where they might form a short between high voltage and ground, thereby burning up all the output transistors. Moreover, while several FETs are included in this string, control can be exerted by less than all of the transistors; that is, the control pulses are applied to less than all the output transistors and the remaining transistors are switched by a cascade switching sequence across the string.

These and other advantages will be observed on a review of the disclosed high voltage power supply capable of forming pulses of any width at any frequency for a pulsed neutron generator source. While the apparatus has been described only briefly herein, a greater understanding thereof will be obtained on review of the detailed description of the preferred embodiment set forth below which apparatus accomplishes the objects described herein and has the advantages noted above as well as other advantages.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a timing chart.

DETAILED DESCRIPTION OF THE PREFERRED EMBODIMENT

Figure 1:
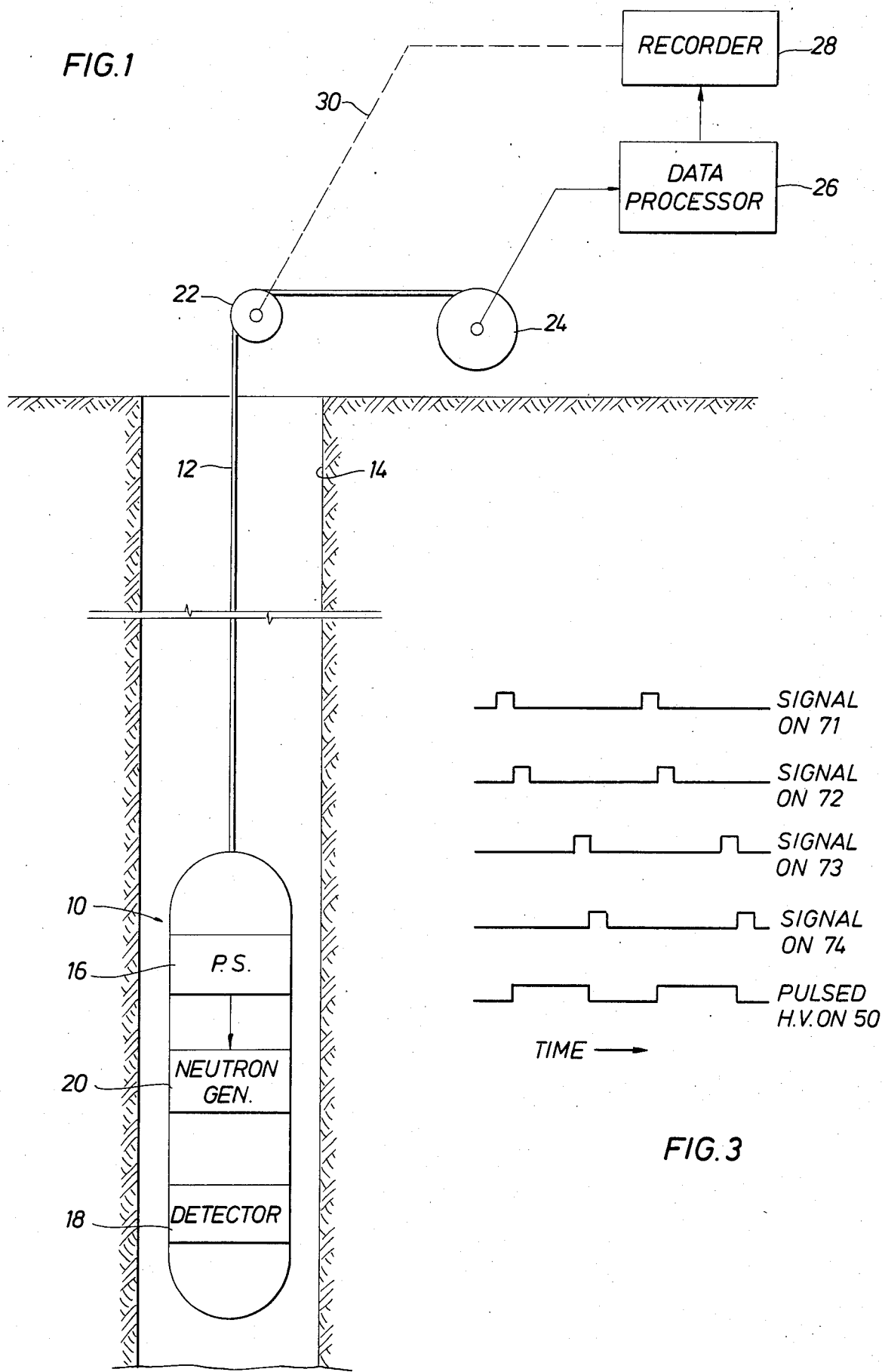
FIG. 1 shows a pulsed neutron logging tool suspended in a borehole and incorporating a neutron generator for bombardment of the adjacent formations with a pulsed neutron flux.

Attention is first directed to FIG. 1 of the drawings where a logging tool 10 is suspended on a logging cable 12 in a borehole 14 to measure the response of the adjacent formation to pulsed neutron flux. In the sonde supporting the present apparatus, the numeral 16 identifies a pwoer supply in accordance with the teachings of this invention. It is connected to a neutron generator tube 20. The neutron generator 20 forms pulsed neutron flux which is directed to the adjacent formation. The neutron flux typically is fourteen Mev neutrons in timed sequence. The neutrons bombard the adjacent formation, and some type of response is noted in a detector 18 in the sonde 10. The detector 18 is connected through the logging cable 12 to provide output signals to the surface. The logging cable 12 is spooled over a sheave 22 and the cable is stored on a drum or reel 24. The cable might be as long as 25,000 feet to obtain measurements from a well of that depth. The cable includes suitable conductors which are output from the cable to a data processor 26. The data processor converts the data into a suitable form which is then input to a recorder 28. The data recorder 28 records the data from the detector 18. Preferably, the data is recorded as a function of sonde depth in the well, and to this end, an electrical or mechanical depth measuring apparatus 30 is connected from the sheave 22 to the recorder 28 whereby the data is recorded as a function of depth. Ordinarily, the sonde 10 is lowered to the bottom of the well and then retrieved, recording data as it is pulled up the borehole, and the data is recorded opposite depth on a suitable recording media for later interpretation and analysis.

Figure 2:
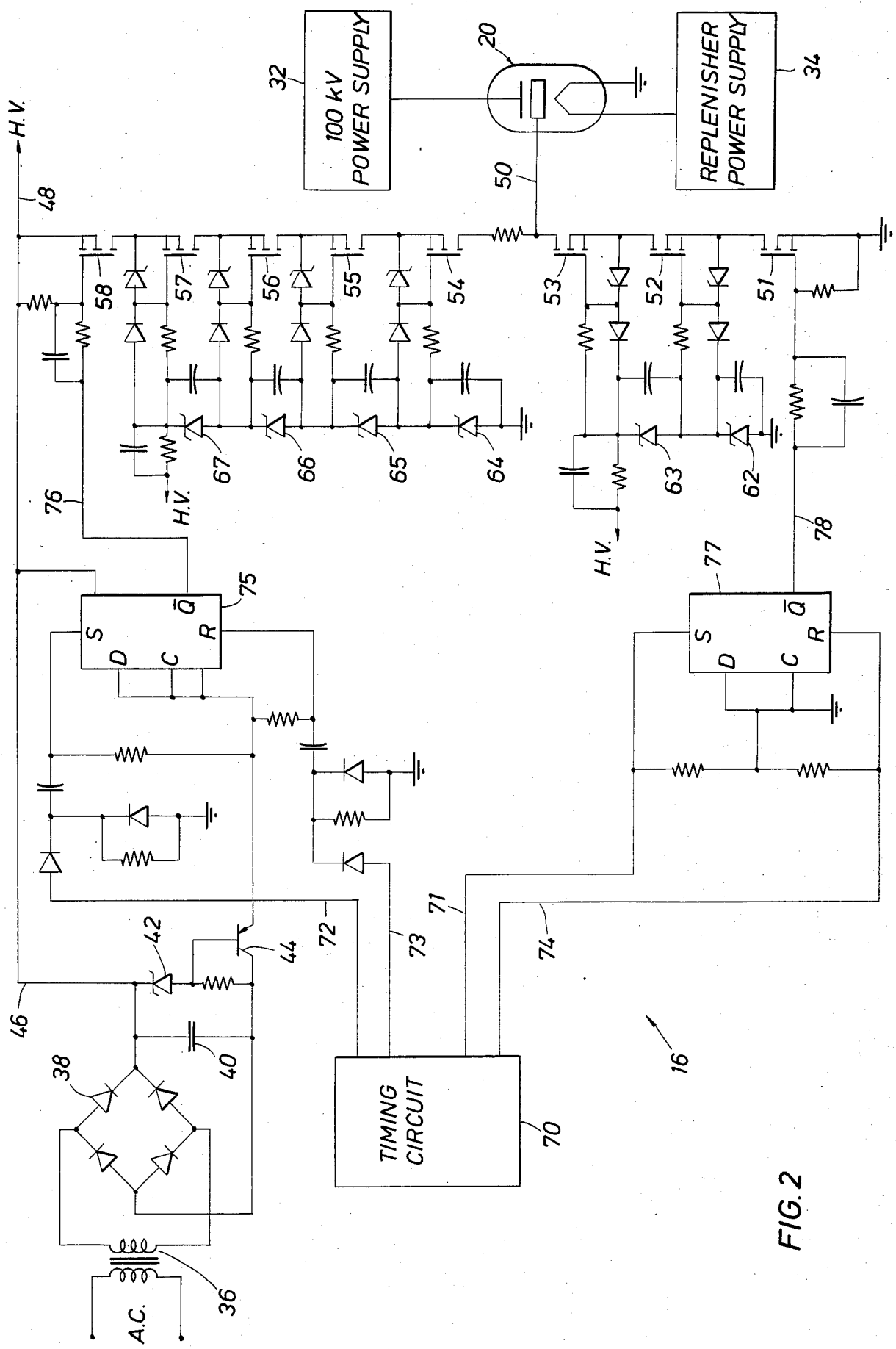
FIG. 2 is a schematic diagram of the power supply of the present invention showing connection to a pulsed neutron generator.

Attention is directed to FIG. 2 of the drawings which shows the power supply 16 connected to the neutron generator 20. First of all, a brief description should be noted regarding the generator 20. It is connected with a high voltage power supply, typically a 100 Kv power supply 32. The suitable high voltage is connected to the target of the neutron generator 20. It is also provided with a replenisher power supply 34. The pulsed neutron generator is sequenced off and on to form neutron bursts in a timed sequence by means of the pulsed power supply circuit 16 shown in FIG. 2.

Operation of this power supply can be understood best by proceeding with a description of the components thereof. A transformer 36 is connected to a suitable alternating current supply. The transformer secondary is connected to a rectifier bridge 38 providing full wave rectification. There is an output filter capacitor 40 to smooth ripple and a Zener diode 42 is connected across the filter capacitor. The diode 42 provides a voltage for a transistor 44 which is further operated to smooth ripple in the output voltage. The power supply described herein preferably provides an output of about minus twelve volts referenced to a conductor 46. The conductor 46 proceeds to other circuit components as will be described. It should be noted that this circuit provides an operating voltage for the circuit components, particularly those associated with forming the control pulses. This supply is floating on a high voltage line. That is, it is isolated from ground.

The numeral 48 identifies a high voltage supply. In the preferred embodiment, this is typically in the range of about 2,000 volts. The high voltage supply 48 is input to the circuit at several locations. At the several connections, the high voltage is normally furnished substantially free of noise and ripple.

FIG. 2 further shows a string of FET transistors. They are divided into two groups. The FET transistors are connected between the high voltage supply 48 and ground. The output conductor 50 is between the two groups of FETs. Considering the two groups, the FET connected to ground is the transistor 51. In addition to that, there is another transistor 52 serially connected. A third transistor 53 completes the lower group. In similar fashion, the upper group includes the transistors 54 through 58 connected serially as illustrated.

Assuming that about 2,000 volts are applied at the high voltage supply 48, it will be recognized that the full voltage of the supply is across either one group or the other but not both. To this end, the transistors 51, 52 and 53 are preferably rated at about 1,000 volts each. The other group of transistors can utilize transistors having a rating of about 500 volts. It will be further noted that the transistors 51–53 are connected so that the source of the transistors 51 is connected to ground and the drain is connected to the source of the transistor 52. Because of the polarity (compared with the deployment of the transistors in the second group), the transistors 54–58 are inverted compared to transistors 51–53. That is, the transistor 51 is connected to ground through the source. Contrary to this, the transistor 58 is connected to the high voltage supply 48 through its source.

It will be further noted only the transistors 51 and 58 receive control signal inputs. That is, pulses are applied to these transistors only and switching of this pair control switching of all the circuitry. To this end, the transistors 52–57 operate on a ripple effect. More will be noted concerning this later. This is accomplished by providing the transistor 52 with a gate input voltage which is determined by a diode and resistor network connected to it. The illustrated network of various Zener diodes connected to the gases of transistors 52–57 is provided to enable and insure that the gate voltages are spaced so that the full drop from the supply (2,000 volts in this embodiment) is not across a single transistor. By spreading the intermediate points between ground and 2,000 volts, it is possible to use derated FETs. In this embodiment, the transistors 51–53 can be rated at 1,000 volts. To this end, the string of Zener diodes controlling the intermediate points include diodes 62 and 63 for the lower set of transistors, and diodes 64–67 in the upper section of FETs. In the upper section, the 2,000 volt differential can be spread across the five FETs and therefore requires only that they operate at about 500 volts each. As will be further observed, the respective gates of transistors 52–57 are clamped by diode and Zener diode networks connected from the source to the setpoint Zeners.

A timing circuit 70 forms four pulses for operation of the pulsed power supply 16. The timing circuit 70 forms four outputs on four conductors. One is on a conductor 71. A second conductor 72 is also output. FIG. 3 shows timing of a pulse on the conductor 71 which occurs one or two microseconds in advance of the pulse on the conductor 72. It is important that they occur in this sequence, namely, an on pulse applied on the conductor 71 before an on pulse is placed on the conductor 72. There is an additional conductor 73 which connects with other circuitry in conjunction with the conductor 72 (all will be described hereinafter) and both have superimposed pulses on them. The pulse on conductor 73 best occurs one or two microseconds in advance of a pulse on the conductor 74.

The relative position of the four pulses in FIG. 3 shows the relative sequence. The timing circuit 70 controls a burst of neutrons during the interval determined by these four pulses. That neutron burst occurs beginning with receipt of the pulse on the conductor 72 which defines the leading edge of the neutron burst and extends until the pulse on the conductor 73 has occurred. More will be noted regarding the disposition of these pulses hereinafter. It will be observed that the conductors 72 and 73 are input to the set and reset terminals of a flip-flop. The flip-flop 75 forms an output on the $\overline{Q}$ terminal which is input by conductor 76 to the gate of the FET 58. In similar fashion, a flip-flop 77 is providd with the conductors 71 and 74 input to the set and reset terminals respectively. Again, the output is formed on the $\overline{Q}$ terminal and provided on a conductor 78 to the gate of the FET 51.

Consider now the sequence of operation shown in FIG. 3. Keep in view that the timing circuit 70 forms pulses applied to the conductors in sequence, that is, a pulse is first placed on the conductor 71 and thereafter on the conductor 72. Pulses are applied to conductors 73 and 74 in that sequence all as shown in FIG. 3.

A pulse on the conductor 71 achieves the following results. Assume initially that the bottom section of three FETs is on (or conductive) while the top section is off or non-conductive. In the event, the voltage on the conductor 50 is not high voltage and is approximately ground voltage. Proper operation of the neutron generator 20 requires a positive pulse of about 2,000 volts. That pulse is formed on the conductor 50 for the neutron generator 20. Accordingly, the initial condition finds the bottom section on, bringing the conductor near to ground. No current flows through the top FETs because they are switched off or block the application of high voltage to the conductor 50. When a pulse is applied on the conductor 71, to the flip-flop 77, this forms a negative going pulse on the conductor 78 and cuts off the transistor 51. When it is cut off, current flow through the transistors 52 and 53 is also cut off, and the diode biased circuitry for the transistors 52 and 53 cuts each one off in sequence in a ripple. This then permits the conductor 50 to be isolated from ground so that it can either be at ground or at high voltage depending on the upper set of FETs. The next pulse of interest is formed on the conductor 72 and is applied to the set terminal of the flip-flop 75. This causes the flip-flop 75 to form a negative going pulse on the conductor 76. A negative going pulse is thus applied to the gate of the transistor 58. Recall that the transistor 58 is inverted in contrast with the transistor 51. Accordingly, the negative going pulse switches the transistor 58 on or makes its conductive. When it conducts, it causes conduction through the transistor 57 and in cascade effect transistors 56, 55 and 54. The several transistors are rippled in relatively high speed. This makes all the transistors conductive between the conductor 50 and the high voltage supply 48. It brings the conductor 50 to about 2,000 volts and thereby applies the high voltage to the neutron generator tube 20.

It is desirable to accomplish switching in this sequence. It is undesirable that all eight transistors be conductive at the same instance because that would substantially ground the high voltage supply and would burn up the transistors. Therefore, the lower set of transistors is switched off one or two microseconds in advance of switching the other transistors on to achieve conduction. At this juncture, this condition prevails for an indefinite period, and high voltage through the conductor 50 is supplied to the neutron generator. The interval is determined by the timing circuit 70.

The timing circuit subsequently operates to switch off the pulse of high voltage applied to the neutron generator 20. Switch off is achieved by providing a pulse on the conductor 73 and a follow-up pulse on the conductor 74, the two pulses being separated typically about one or two microseconds. First of all, the pulse on the conductor 73 reverses the operative state of the flip-flop 75 and forms a positive going output pulse on the conductor 76. That is applied to the gate of the transistor 58 and switches that transistor off, rendering it non-conductive. When it switches off, a ripple effect is observed through the serially connected FETs. This drops the voltage at the conductor 50 from the high voltage of the supply 48 toward ground potential. After this has occurred, the pulse on the conductor 74. reverses the operative state of the flip-flop 77 and forms a control pulse for the FET 51. That transistors is then operated to switch from off to on, thereby rippling through the transistors 52 and 53. This brings the conductor 50 close to ground potential and completes grounding of the conductor 50. At this point in time, the neutron burst from the neutron generator 20 has been terminated.

The control circuit 70 is thus operated to vary the time span between the pulses 72 and 73. This time span determines the duration of the neutron burst. Because it can be widely tuned, substantially any practical pulse width can be obtained and pulse spacing or frequency of pulses can likewise be modified. Ideally, there is a lag time of about one or two microseconds at the start of each pulse and at the end of each pulse to insure interlocking of the pulses on the conductors 71-74, inclusive. Further, the pulses on the four conductors need not be long pulses but can be relatively short, as short as practical depending on the speed of the flip-flops 75 and 77.

From the foregoing, it will be observed how pulse width and frequency of the neturon generator can be controlled through the power supply 16 of this disclosure. This apparatus is operative at temperatures typically encountered in deep wells. Thermal runaway has little impact on the operation of the circuit so that it can be operated in the manner described both at ambient temperatures and the elevated temperatures observed in deep wells.

While the foregoing is directed to the preferred embodiment, the scope of the disclosure is determined by the claims which follow.

What is claimed is:

1. For use with a pulsed neutron generator in a logging tool lowered in a borehole, a pulsed high voltage source having an output terminal adapted to be connected to pulse neutron generator, the power supply comprising:
   (a) high voltage supply means;
   (b) field effect transistor means comprising at least a pair of field effect transistors serially connected between said high voltage supply means and ground;
   (c) an output terminal between the two transistors of said field effect transistor means, said output terminal adapted to be connected by a conductor to provide pulsed high voltage to a neutron generator;
   (d) control pulse forming means connected to the gates of the respective two transistors, said pulse forming means forming control pulses selectively switching said transistors off and on in timed sequence to thereby connect the output terminal to said high voltage supply means, and
   (e) diode means connected to said gates of said transistors to limit gate voltage for operation of said transistors.

2. The apparatus of claim 1 including a series cascade of FETs comprising said transistor means, said FETs having gate terminals connected to control voltage means.

3. The apparatus of claim 1 further including means controlling operation of said pair of transistors to prevent making said transistors simultaneously conductive.

4. The apparatus of claim 1 including a floating power supply connected on said high voltage supply means and floating thereon, and also connected to said control pulse forming means.

5. The apparatus of claim 1 wherein said control pulse forming means forms interlocked pulses of said two transistors.

6. The apparatus of claim 1 wherein said diode means are connected to the gates of serially connected FETs comprising said transistor means, and wherein said diode means is connected to clamp gate voltage.

7. The apparatus of claim 1 wherein said control pulse forming means forms two control pulses for said pair of transistors, and the pulses are timed in occurrance and overlap.

8. The apparatus of claim 7 wherein the pulses are formed by flip-flop means to sequence switching of said transistor pair.

9. The apparatus of claim 1 wherein said transistor means comprises said pair of FETs serially connected so that each of said FETs has a gate terminal adapted to be connected to said control pulse forming means to receive a control pulse at each of said gates for transistor switching.

10. The apparatus of claim 9 wherein said transistors are inverted compared to each other, and said gates are thereby enabled to be oppositely driven.

11. The apparatus of claim 10 including means within said control pulse forming means for forming a pulse of one polarity to turn one of said transistors on and wherein a pulse of the same polarity turns off the other of said transistors.

12. The apparatus of claim 11 including series connected third and fourth transistors each having gates, and bias circuit means connected to said gates to cause said third and fourth transistors to operate in response to operation of said first two transistors.

13. The apparatus of claim 1 including flip-flops in said control pulse forming means forming timed signals for operation of said two transistors.

* * * * *